United States Patent
Chen et al.

[11] Patent Number: 5,883,014
[45] Date of Patent: Mar. 16, 1999

[54] METHOD FOR TREATING VIA SIDEWALLS WITH HYDROGEN PLASMA

[75] Inventors: Shiaw-Rong Chen, Chung Ho; Horng-Bor Lu; Jenn-Tarng Lin, both of Hsinchu, all of China

[73] Assignee: United Microelectronics Corp., Taiwan, China

[21] Appl. No.: 968,746

[22] Filed: Aug. 5, 1997

[30] Foreign Application Priority Data

Jun. 3, 1997 [TW] Taiwan ................................. 86107562

[51] Int. Cl.⁶ .................................................. H01L 21/02
[52] U.S. Cl. ......................... 438/782; 438/782; 438/624; 438/629; 438/637; 438/639; 438/672; 438/692; 438/780; 438/798; 438/631; 438/626
[58] Field of Search ..................... 438/624, 626, 438/627, 629, 631, 637, 639, 672, 692, 780, 782, 798

[56] References Cited

U.S. PATENT DOCUMENTS

| | | | |
|---|---|---|---|
| 5,280,190 | 1/1994 | Lu | 257/587 |
| 5,286,675 | 2/1994 | Chen et al. | 438/624 |
| 5,294,836 | 3/1994 | Kishi | 257/750 |
| 5,472,890 | 12/1995 | Oda | 438/305 |
| 5,498,889 | 3/1996 | Hayden | 257/301 |
| 5,506,177 | 4/1996 | Kishimoto et al. | 438/624 |
| 5,652,182 | 7/1997 | Cleeves | 438/626 |
| 5,691,240 | 11/1997 | Yang | 438/626 |
| 5,719,083 | 2/1998 | Komatsu | 438/652 |
| 5,729,041 | 3/1998 | Yoo et al. | 257/529 |
| 5,763,954 | 6/1998 | Hyajutake | 438/624 |

*Primary Examiner*—Charles Bowers
*Assistant Examiner*—Thanh Nguyen
*Attorney, Agent, or Firm*—Finnegan, Henderson, Farabow, Garrett & Dunner, L.L.P.

[57] ABSTRACT

A method for treating via sidewalls comprising the steps of providing a substrate having a number of metallic wires already formed; depositing a liner oxide layer; depositing an organic spin-on-glass layer; and depositing a second oxide layer. The second oxide layer is planarized by a chemical-mechanical polishing method. Photolithographic and etching methods, employing oxygen plasma treatment as well as a wet etching removal method are used to form vias above the metallic layers. A hydrogen plasma treatment is performed for the via sidewalls to prevent the occurrence of out-gassing and to obtain superior electrical properties. A titanium/titanium nitride film is deposited, and aluminium or tungsten is deposited into the vias and to form aluminium or tungsten plugs, thus completing the manufacturing process according to this invention. A semiconductor device formned by this method is also described.

10 Claims, 3 Drawing Sheets

METHOD FOR TREATING VIA SIDEWALLS WITH HYDROGEN PLASMA

BACKGROUND OF THE INVENTION

1. Field of Invention

This invention relates to a method for treating via sidewalls, and more particularly to a method of using hydrogen plasma to treat organic spin-on-glass (SOG) via sidewalls in a manufacturing process of inter-metal dielectric semiconductor devices (IMD). The invention also includes a semiconductor device resulting from this method.

2. Description of Related Art

In conventional manufacturing processes for semiconductors, spin-on-glass is a fairly simple planarization technique. The main constituent of commonly used SOG is either a silicate or a siloxane. For a siloxane SOG, owing to the presence of organic functional groups, for example, methyl($CH_3$) or benzyl($C_6H_5$) groups from which the organicity for the SOG is derived, resistance against cracking of the SOG layer is very much improved, especially after the expulsion of residual solvent from the SOG layer through a heat treatment process (also known as "curing"). However, in practical applications, residual solvent and moisture can easily be retained leading to out-gassing in subsequent processes. For example, no matter whether an etched or non-etched process is used in the fabrication of IMD, subsequent heat treatment in the formation of aluminium or tungsten plugs will generate out-gassing. If the out-gassing from the SOG layer happens to be along the sidewalls of the vias, then electrical potential will be adversely affected by the change because of the increase in via resistance and poor connection with the metallic interconnects.

FIGS. 1A through 1D are cross-sectional views showing the progression of steps in a conventional treatment method for via sidewalls. Referring to FIG. 1A, in the manufacturing process for an inter-metal dielectric layer of a semiconductor, a liner oxide layer 104 is first deposited over a substrate 10 with metallic wires 102 already formed thereon. Then, an organic SOG layer 106 is deposited over the liner oxide layer 104, and making use of its good gap-filling ability, planarization of the area is achieved. Subsequently, a partial etching back processing of the SOG layer 106 may be performed to obtain a better planarized surface, or the partial etching back processing may be eliminated to save the corresponding production cost. Thereafter, a second oxide layer 108 is deposited above the SOG layer to form the whole inter-metal dielectric layer and a cross-sectional view as shown in FIG. 1B is obtained. The SOG layer 106 can be either fluidic or non-fluidic and a chemical-mechanical polishing operation can be further applied to obtain a better global planarization for the second oxide layer 108.

Next, via holes 110 are formed by suitable applications of photolithographic and etching processes. For example, etching can be carried out using an oxygen plasma treatment 112 and a wet etching removal method, and a cross-section as shown in FIG. 1C finally can be obtained. Thereafter, referring to FIG. 1D, tungsten or aluminium plug material 114 is used to fill up the via holes 110. However, owing to the out-gassing along the sidewalls of the via holes 110, defective portions 116 are formed in the via holes 110 and so a functionally inferior semiconductor product is obtained.

SUMMARY OF THE INVENTION

It is therefore an object of this invention to provide a method for treating via sidewalls in the manufacturing of inter-metal dielectric layer that utilizes hydrogen plasma to eliminate out-gassing from the via sidewalls of an organic SOG layer and produce a semiconductor product having a better functional performance.

Additional objects and advantages of the invention will be set forth in part in the description which follows, and in part will be obvious from the description, or may be learned by practice of the invention. The objects and advantages of the invention will be realized and attained by means of the elements and combinations particularly pointed out in the appended claims.

To achieve the objects and in accordance with the purpose of the invention, as embodied and broadly described herein, the invention comprises a method for treating the via sidewalls of a semiconductor device which comprises the steps of providing a substrate having a number of metallic wires formed thereon; depositing a first oxide layer on the substrate; depositing a spin-on-glass layer on the first oxide layer; depositing a second oxide layer on the spin-on-glass layer; planarizing the second oxide layer; selectively etching portions of the first and second oxide layers and the spin-on-glass layer to form vias above the metallic layers; treating the via sidewalls with hydrogen plasma; depositing a titanium/titanium nitride film on the vias; and depositing metal to fill the vias.

It is preferred that the step of depositing the first oxide layer include forming a liner oxide layer. Preferably, the step of depositing the spin-on-glass layer includes forming an organic spin-on-glass layer, and the spin-on-glass layer may be a fluidic layer or a non-fluidic layer. A partial etching back operation may be performed to obtain a more planar spin-on-glass layer after the step of depositing the spin-on-glass layer. In addition, the second oxide layer may be planarized using chemical-mechanical polishing. Preferably, the step of selectively etching includes oxygen plasma treatment and wet etch removal.

The invention also encompasses a semiconductor device comprising a semiconductor substrate having a metallic wiring pattern thereon; a first oxide layer on the substrate; a spin-on-glass layer on the first oxide layer; a second planarized oxide layer on the spin-on-glass layer; and a plurality of vias through the first and second oxide layers and spin-on-glass layer, each of the vias including a barrier film and an inner metal plug.

It is to be understood that both the foregoing general description and the following detailed description are exemplary and explanatory only and are not restrictive of the invention, as claimed.

BRIEF DESCRIPTION OF THE DRAWINGS

The accompanying drawings, which are incorporated in and constitute a part of this specification, illustrate one (several) embodiment(s) of the invention and together with the description, serve to explain the principles of the invention. The description is made with reference to the accompanying drawings in which.

DESCRIPTION OF THE PREFERRED EMBODIMENT

Figure 1A:
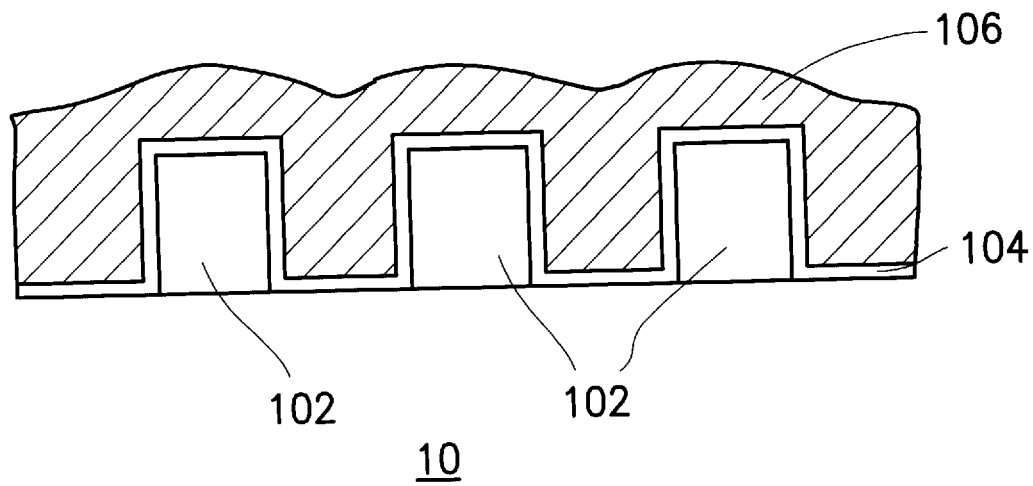
FIGS. 1A through 1D are cross-sectional views showing the progression of steps in a conventional treatment method for via sidewalls.
Figure 1B:
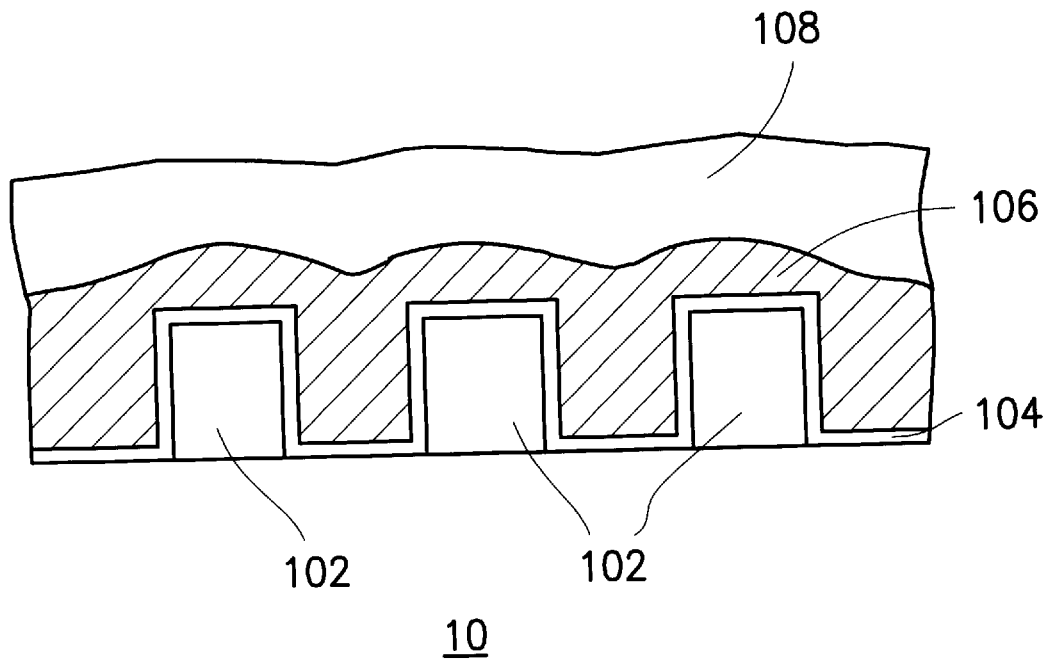
Figure 1C:
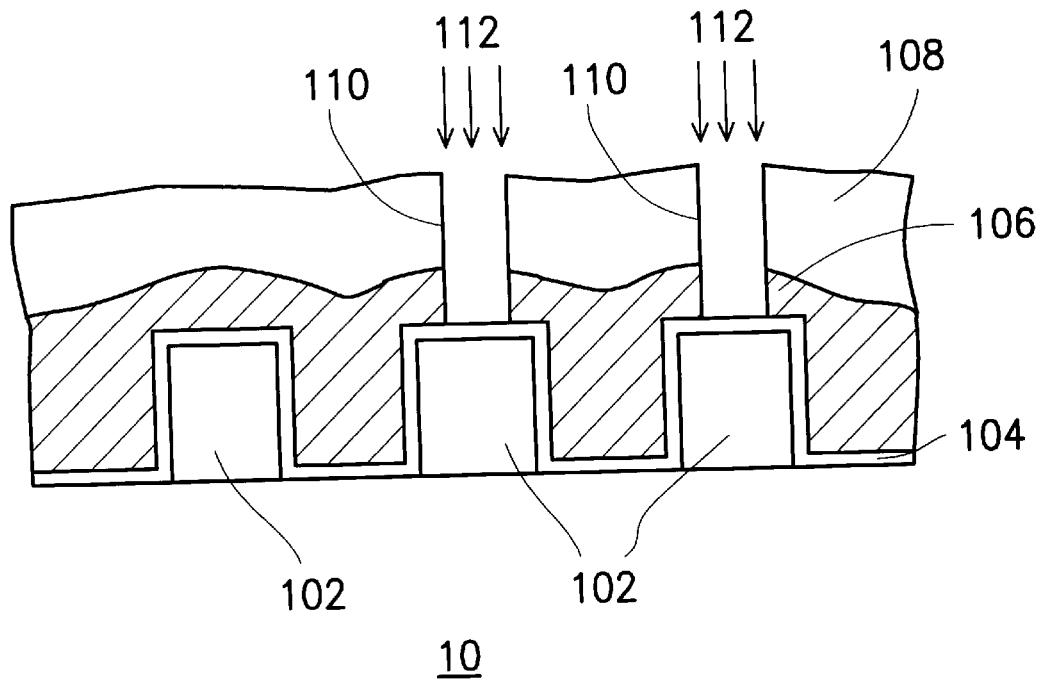
Figure 1D:
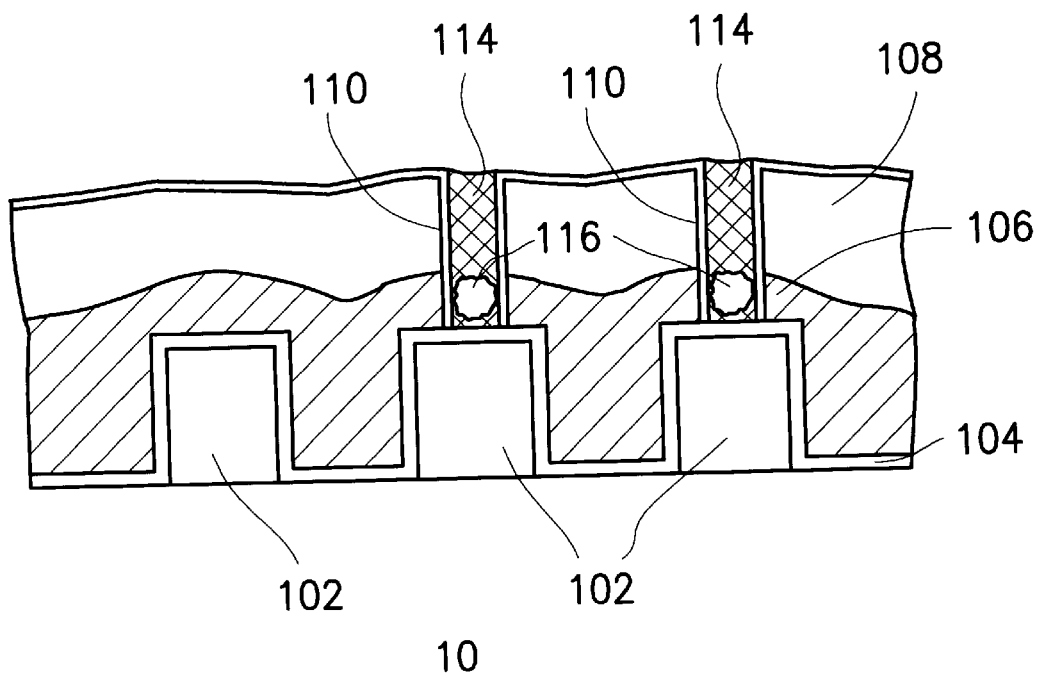

Reference will now be made in detail to the present preferred embodiment of the invention, an example of which is illustrated in the accompanying drawings. Wherever possible, the same reference numbers will be used throughout the drawings to refer to the same or like parts. Referring to FIGS. 1A through 1C together with FIGS. 2A and 2B, they are the cross-sectional views showing the progression of steps in the treatment of via sidewalls according to the preferred embodiment of the invention. In this embodiment, part of the front-end section of the manufacturing process is identical to the conventional method. For example, the steps as shown from FIGS. 1A through 1C. Hence, detailed description of the identical steps are not repeated here. Instead, FIG. 1C is used as the foundation structure for describing subsequent processing. Furthermore, to facilitate a clear explanation, structurally similar parts of this embodiment that are identical to FIG. 1C are labeled with identical numerals.

Figure 2A:
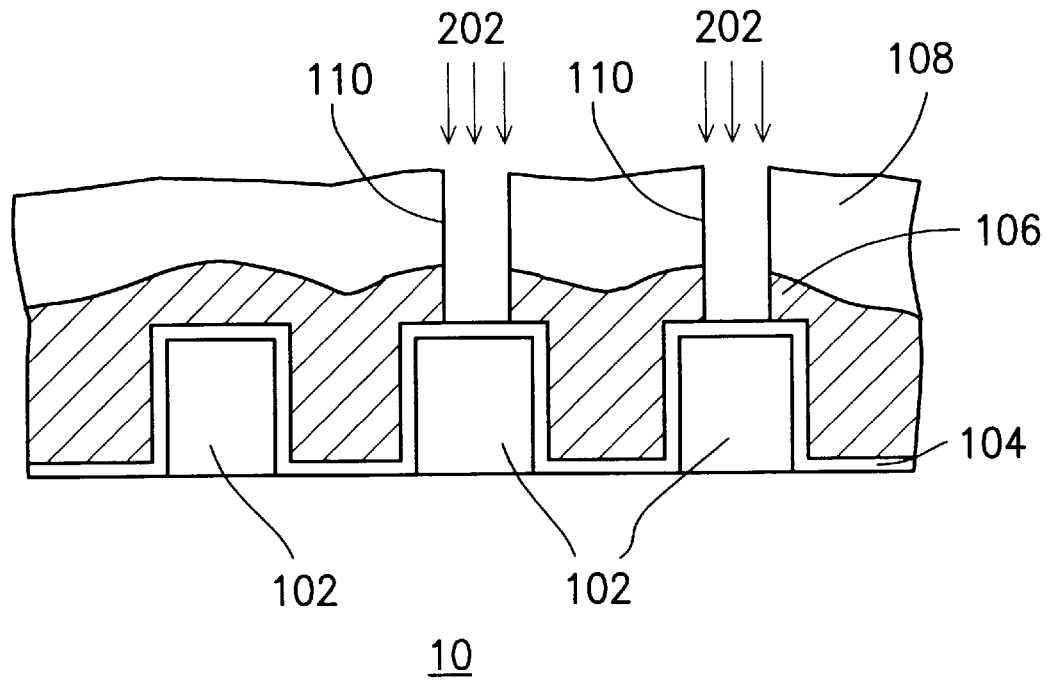
FIGS. 2A and 2B are cross-sectional views showing the progression of steps in the treatment of via sidewalls according to the preferred embodiment of the invention.

Referring to FIG. 2A, after an oxygen plasma treatment 112, the via sidewalls 110 are further treated by hydrogen plasma 202 to allow the exposed via sidewalls 110 in the SOG layer 106 to achieve a certain degree of stability and consolidation caused by the lowering of organic components and hydroxide groups.

Figure 2B:
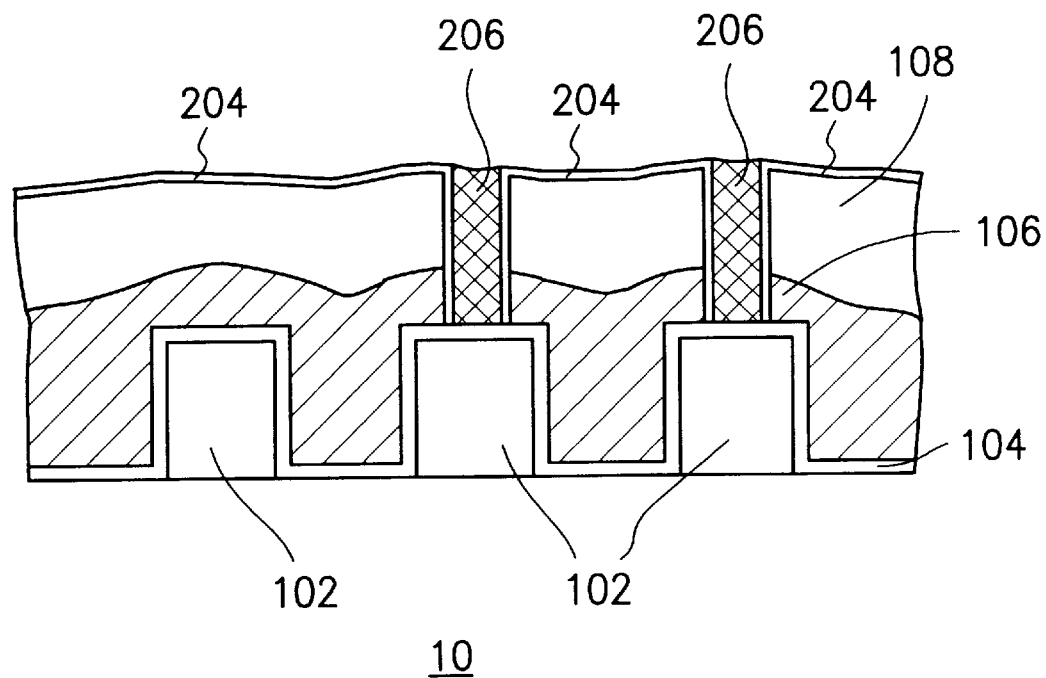

Finally, referring to FIG. 2B, a titanium/titanium nitride film 204 is deposited over the aforementioned vias 110 acting as a barrier layer for increasing the adhesive strength with subsequently filled metal. Thereafter, the vias are filled up with aluminium or tungsten to form aluminium or tungsten plugs 206. Since there is no more out-gassing, the purpose for performing the via sidewall treatment according to the invention is thus served.

Hence, the first characteristic of this invention is the inclusion of an additional hydrogen plasma treatment for the via sidewalls in the production of inter-metal dielectric layer so as to avoid any out-gassing.

The second characteristic of this invention is that through the elimination of out-gassing from the via sidewalls, metallic interconnects having superior properties are obtained resulting in an improved functional performance.

While the invention has been described by way of example and in terms of the preferred embodiment, it is to be understood that the invention is not limited to the disclosed embodiments. To the contrary, it is intended to cover various modifications and similar arrangements as would be apparent to those skilled in the art. Therefore, the scope of the appended claims, which define the invention, should be accorded the broadest interpretation so as to encompass all such modifications and similar structures.

What is claimed is:

1. A method for treating via sidewalls of a semiconductor device which comprises the steps of:

providing a substrate having a number of metallic wires formed thereon;

depositing a first oxide layer on the substrate;

depositing a spin-on-glass layer on the first oxide layer;

depositing a second oxide layer on the spin-on-glass layer;

planarizing the second oxide layer;

selectively etching portions of the first and second oxide layers and the spin-on-glass layer to form vias above the metallic layers;

treating the via sidewalls with hydrogen plasma;

depositing a titanium/titanium nitride film on the vias; and depositing metal to fill the vias.

2. A method according to claim 1, wherein the step of depositing the first oxide layer includes forming a liner oxide layer.

3. A method according to claim 1, wherein the step of depositing the spin-on-glass layer includes forming an organic spin-on-glass layer.

4. A method according to claim 1, wherein the step of depositing the spin-on-glass layer includes forming a fluidic layer.

5. A method according to claim 1, wherein the step of depositing the spin-on-glass layer is non-fluidic.

6. A method according to claim 1, also including the step of performing a partial etching back operation to obtain a more planar spin-on-glass layer after the step of depositing the spin-on-glass layer.

7. A method according to claim 1, wherein the step of planarizing the second oxide layer includes chemical-mechanical polishing.

8. A method according to claim 1, wherein the step of selectively etching includes oxygen plasma treatment and wet etch removal.

9. A method according to claim 1, wherein the step of depositing metal includes using aluminium.

10. A method according to claim 1, wherein the step of depositing metal includes using tungsten.

* * * * *